United States Patent [19]

Waller

[11] Patent Number: 5,313,433
[45] Date of Patent: May 17, 1994

[54] WINDOWED FLASH WRITE CIRCUIT

[75] Inventor: William K. Waller, Boise, Id.

[73] Assignee: Micron Technology, Inc., Boise, Id.

[21] Appl. No.: 943,970

[22] Filed: Sep. 11, 1992

[51] Int. Cl.$^5$ .............................................. G11C 8/00
[52] U.S. Cl. ........................... 365/230.06; 365/230.01;
365/900
[58] Field of Search ....................... 365/230.01, 230.06,
365/900

[56] References Cited

U.S. PATENT DOCUMENTS

| | | | |
|---|---|---|---|
| 4,845,678 | 7/1989 | Van Berkel et al. | 365/230.06 |
| 4,945,509 | 7/1990 | Barrett et al. | 364/900 |
| 5,119,331 | 6/1992 | Sussman | 365/189.01 |

OTHER PUBLICATIONS

D. Whelan, "A Rectangular Area Filling Display System Architecture", Computer Graphics, vol. 16, No. 3, Jul. 1982, pp. 147–153.
Barrett et al., "Four-Bit Look-Ahead Mask Generator", IBM TDB, vol. 26, No. 1, Jun. 1983.
Micron Technology, Inc., Product Brochure, "Multiport Dynamic RAM", 1990.
Micron Technology, Inc., Product News, "1MEG Video Ram-Description & Function", 1989.
Jeff Mailloux, et al., "Designing Solutions With Multiport DRAMs", Electronic Engineering International, Oct. 1991, pp. 61–66.
Micron Technology, Inc., Brochure, "Triple Port DRAM-256K x 4 DRAM With Dual 512 x 4 SAMs", 1991.
Jeff Mailloux, et al., "Speed Memory, Ease Timing Requirements With VRAM Functions", Nov. 23, 1989, Electronic Design, pp. 95–99.
Micron Technology, Inc., "DRAM Data Book", 1992.

Primary Examiner—Eugene R. LaRoche
Assistant Examiner—Andrew Tran
Attorney, Agent, or Firm—Susan B. Collier

[57] ABSTRACT

The invention is the circuit and method for selecting a window of desired address locations to be written. A start address and a stop address activate a start and stop decoder output respectively. The active start and stop decoder output signals are rippled through start and stop ripple circuitry which enables the outputs electrically interposed between the start and stop addresses respectively. AND circuitry ensures that only the outputs interposed between the start and stop addresses are activated in addition to the start and stop decoder outputs. The activated outputs comprise the window of desired address locations to be written.

28 Claims, 4 Drawing Sheets

FIG. 1
(RELATED ART)

WINDOWED FLASH WRITE CIRCUIT

FIELD OF THE INVENTION

This invention relates to the electrical design utilized in semiconductor manufacturing technology and, more specifically, to the apparatus and method for performing a simultaneous write operation of a plurality of memory cells.

BACKGROUND OF THE INVENTION

A DRAM consists of an arrangement of individual memory cells. Each memory cell comprises a capacitor capable of holding a charge and a field effect transistor, hereinafter referred to as an access transistor, for accessing the capacitor charge. The charge is referred to as a data bit and can be either a high voltage or a low voltage. Therefore, the memory has two states; often thought of as the true logic state and the complementary logic state. An arrangement of memory cells is called an array. There are two options available in a DRAM memory: a bit of data may be stored in a specific cell in the write mode, or a bit of data may be retrieved from a specific cell in the read mode. The data is transmitted on signal lines, also called digit lines, to and from the Input/Output lines, hereinafter known as I/O lines, through field effect transistors used as switching devices and called decode transistors. For each bit of data stored, its true logic state is available at the I/O lines and its complementary logic state is available at lines designated I/O*. For purposes of this discussion, I/O and I/O* lines are often referred to as just I/O lines. Therefore, each cell has two digit lines, referred to as digit line pairs.

In order to read from or write to a cell, the particular cell in question must be selected, also called addressed. Typically, the cells are arranged in the array in a configuration of intersecting rows and columns. In order to select a cell an active output from the row decoder selects a wordline appropriate to the given address. The active wordline then turns on the cell's access transistor. Next the column decoder activates and selects the desired digit line pair. For a write operation the active column decoder output activates the decode transistors to pass the data to be written from the I/O lines to the digit line pair. The data is then coupled through the access transistor to the memory cells which then store the data.

Figure 1:
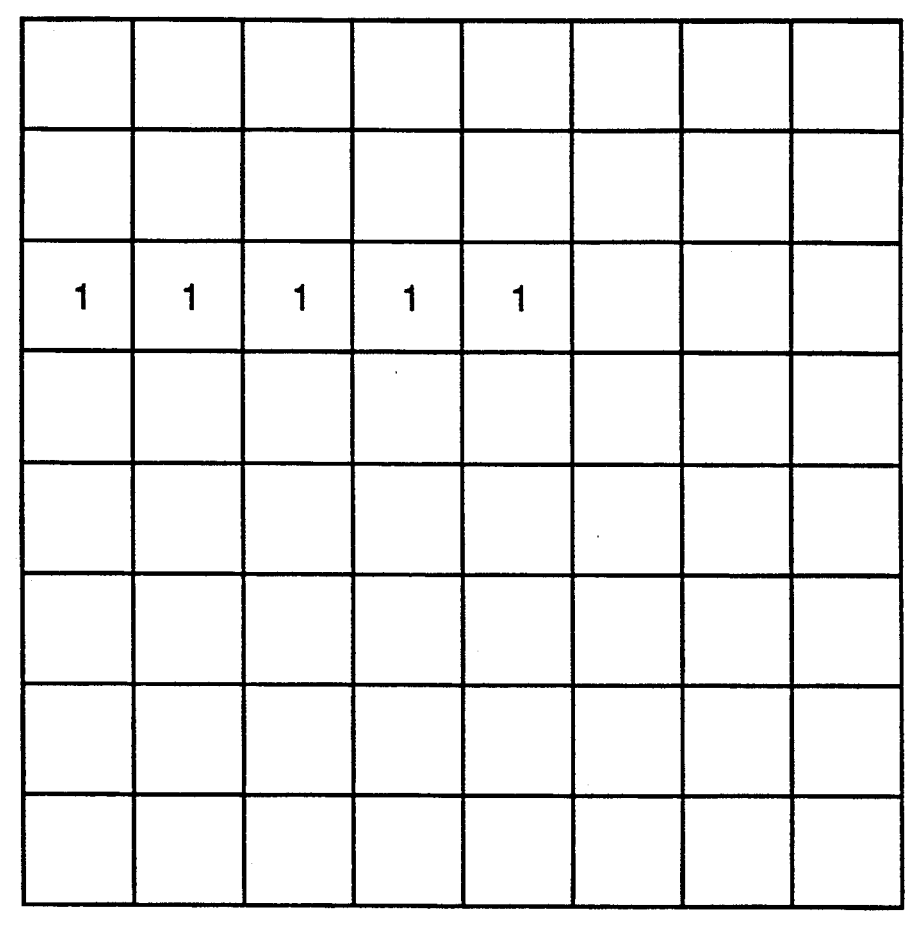

FIG. 1 represents a video display. The video display displays data stored in a memory device. The memory device is typically referred to as a video random access memory (VRAM) device. One example of a video display is a color or monochrome monitor for a personal computer. The data must be pumped to the video display by the VRAM. Each location on the video display is called a pixel.

The VRAM typically contains a DRAM memory in which pixel data is stored and a serial access memory (SAM) port. The data is usually loaded into the VRAM through a DRAM port. The pixel data is typically stored in the DRAM and supplied to the video display through a SAM port.

FIG. 1 is a simplified representation of a video display having 64 pixels. There are different methods employed to get pixel data into the DRAM memory. One method comprises computing a value representing the color of the data and computing an address for each pixel representing the data. The DRAM cycles once for each pixel. For example if the data is represented by the five pixels 1, the DRAM goes through five cycles in order to store the pixel data into the DRAM memory.

A second method can increase the speed of inputting the data into the DRAM. This method is called a block write. The block write method computes a value and an address for four pixels simultaneously. The four pixels comprise the block. The DRAM cycles once for each block of four pixels stored in the DRAM. In this method four pixels are typically accessed in each cycle. It would therefore require two cycles to implement the previous example wherein the data is defined by five pixels.

A third method of loading the data into the DRAM can increase the speed over the block write. This method is called a flash write. In a flash write all of the column addresses for a given row are loaded in one cycle. The disadvantage of the flash write is the inability to load only a portion of the column addresses for a given row.

Since a specific address is used to identify each pixel there must be a method for decoding that address. A column decoder is typically used to decode the address. A tree type column decoder is typically used as the column decoder. The tree column decoder is implemented in a NOR configuration such that when the proper inputs are low the desired column decoder output goes high.

Micron Semiconductor, Inc. distributes a "1992 DRAM Data Book," of which sections 3 and 1 are hereby incorporated by reference, containing detailed descriptions of Micron's VRAM devices. An article published in *Electronic Design* Nov. 23, 1989, entitled "Speed Memory, Ease Timing Requirements With VRAM Functions," by Mailloux, et al., describes many of the features used to speed data transfer to and from an associated graphics processor or microprocessor and is also incorporated by reference.

SUMMARY OF THE INVENTION

In VRAM technology there exists a need to move windowed data to the video display in the shortest period of time without the use of cumbersome circuitry or methods.

A solution to this problem is provided by the Applicant's supplies a start and stop address for a selected row. The start and stop addresses each activate a corresponding column decoder output and the invention automatically activates the address locations interposed between the start and stop addresses, thereby quickly accessing a window of addresses to be written. Thus, in the example shown in FIG. 1, only one cycle is required to load the data representing the five pixels.

The invention is the circuit and method for activating a window of desired addresses to be written. A start address and a stop address activate a start and stop decoder output respectively. The outputs electrically interposed between the start and stop addresses are enabled by both start ripple circuity and stop ripple circuitry. AND circuitry ensures that only the outputs interposed between the start and stop comprise the window of desired addresses to be written.

The decoder outputs thus activated, in turn, activate corresponding decode transistors. The data is transmitted through the decode transistors from the I/O lines to the corresponding digit line pair. Former data is retained in the storage locations for all of the non-activated column address locations.

Features of the present invention will become clear from the following detailed description of the invention, taken in conjunction with the accompanying drawings.

BRIEF DESCRIPTION OF THE DRAWINGS

FIG. 1 is provided to illustrate an example explaining the related art.

Figure 2:
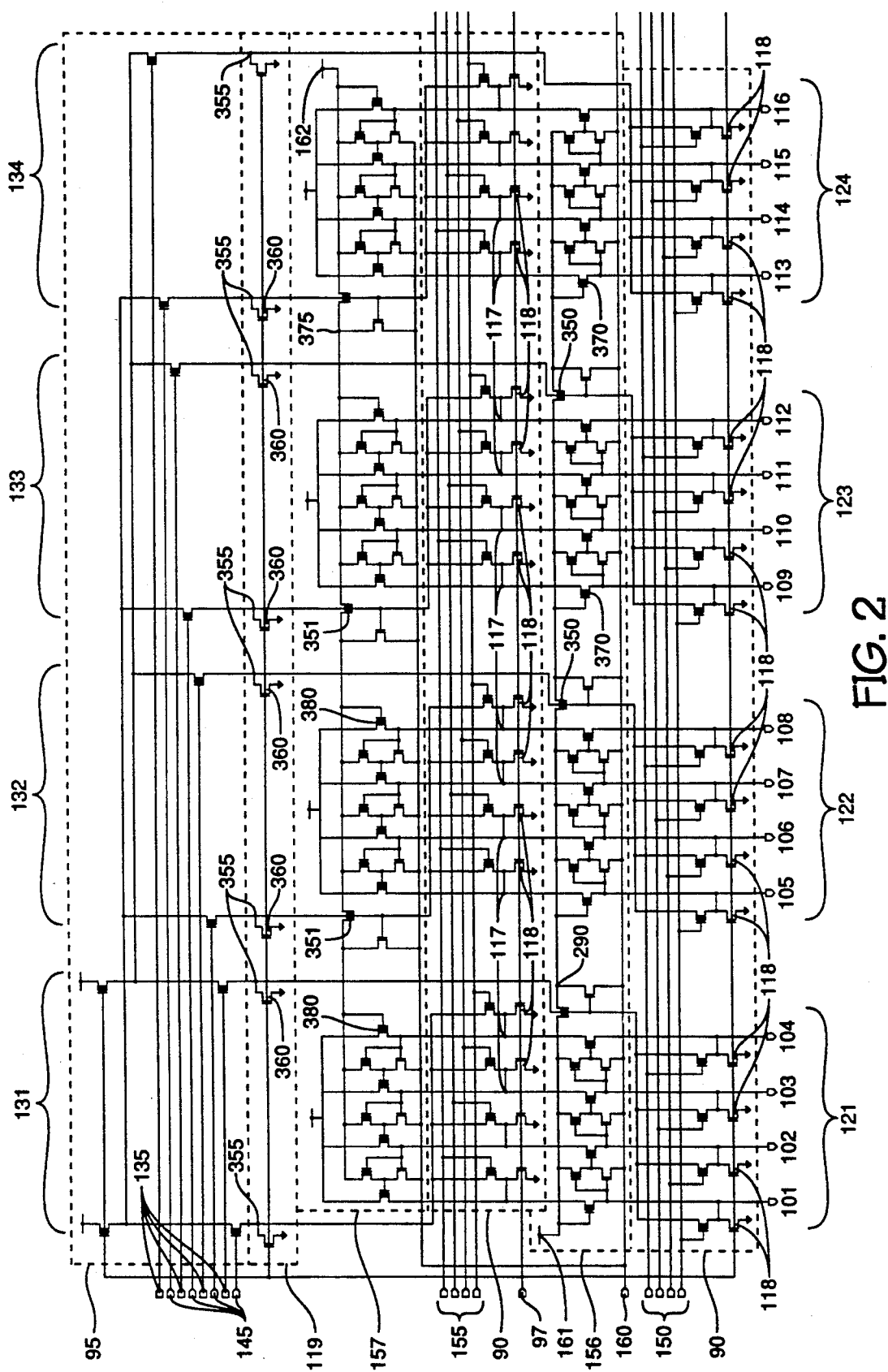
FIG. 2 is a detailed schematic of a preferred embodiment of a 16 output column decoder version of the invention.

Attached hereto is an enlarged view of the drawing of FIG. 2 containing indicia representing input signals for the Examiner's use during the prosecution of this case.

Figure 3:
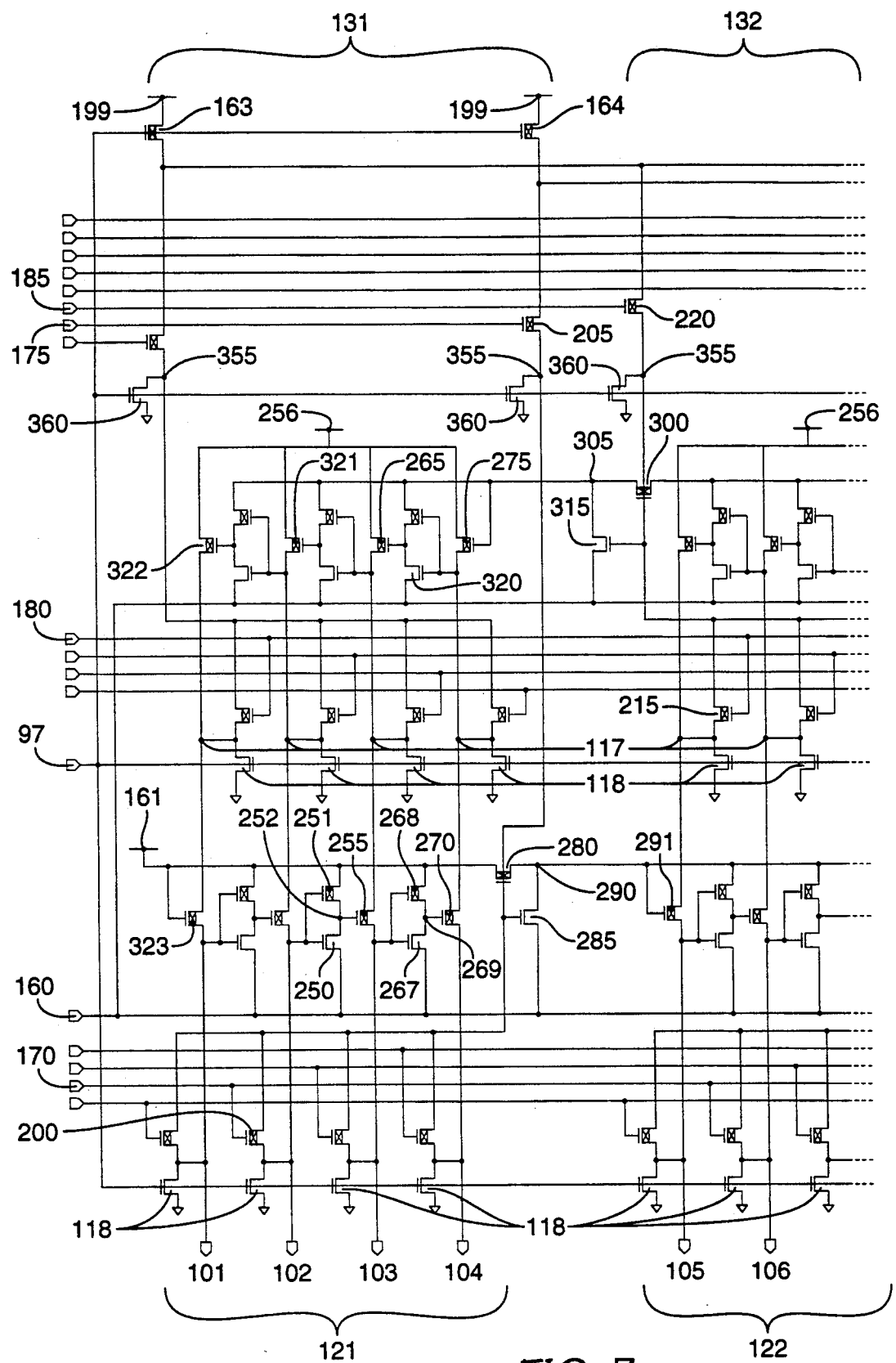

FIG. 3 is a portion of the detailed schematic of FIG. 2.

Figure 4:
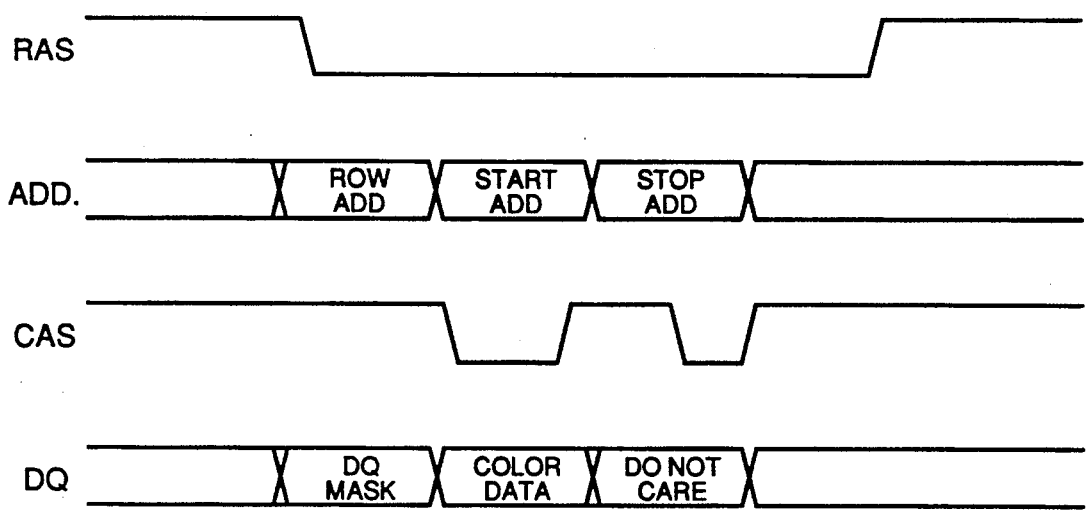

FIG. 4 is a timing diagram of a typical cycle of the invention.

DETAILED DESCRIPTION OF THE PREFERRED EMBODIMENT

The object of the invention is to increase the speed of the video random access memory (VRAM) device by deceasing the time required to write graphical data into the display memory.

The invention features a dynamic column decoder wherein the active outputs of the column decoder enable the decode transistors. The data is transmitted to the corresponding digit line pair from the selected I/O lines. A feature of the invention is ripple AND circuitry that automatically activates all decoder outputs electrically interposed between an activated start decoder output selected by a start address and an activated stop decoder output selected by a stop address.

The invention facilitates the rapid automatic activation of a window of column decoder outputs. Since the invention typically reduces the number of DRAM cycles required to perform the write operation, it provides a much faster way to write graphic data into a VRAM than the circuits and methods currently employed. The invention is an improvement over flash write since only the desired column decoder outputs are activated rather than all of the column decoder outputs as is the case in the flash write.

FIG. 2 is the circuit of the preferred embodiment. The circuit comprises a column decoder 90 implemented with a tree decoder 95. The circuit is designed such that a start and a stop address can be selected by the user. The selection of the start and stop address automatically activates a start and stop decoder output and all intervening decoder outputs. These activated decoder outputs create a window of decoder outputs capable of activating decode transistors in electrical communication with a corresponding window of I/O lines. The data on the windowed I/O lines is then transmitted to the selected digit line pairs.

Although the circuit of the invention provides a column decoder to perform the windowed flash write implementation of the invention, the column decoder can also be used to perform a normal write to a single cell or to perform a typical block write.

When the active low column decode enable (COLDECEN*) signal goes low at the COLDECEN* input node 97 all 16 of the column decoder output nodes 101-116 and intermediate nodes 117 electrically float at the low potential at which they were held when the inactive COLDECEN* signal activated transistors 118. The low COLDECEN* signal also enables the tree decoder 95 and enables a portion 119 of look ahead circuitry.

Although this embodiment describes a circuit having 16 column decoder outputs, column decoders having a lessor or greater number of outputs may be used without departing from the spirit and scope of the invention.

The column decoder output nodes 101-116 are arranged in groups 121-124, each group 121-124 having four column decoder outputs each. The group size and arrangement are typically dependent on the particular addressing scheme the designer employs. Other address schemes are equally viable and may be used in lieu of the address scheme described herein.

The tree decoder 95 comprises four separate sections 131-134 corresponding respectively to the column decoder output groups 121-124. One of the tree decoder sections 131-134 is enabled by the selected address and in turn enables the corresponding column decoder output group 121-124. An active tree decoder start signal at one of the tree decoder start input nodes 135 or an active tree decoder stop signal at one of the tree decoder stop input nodes 145 enables one of the tree decoder sections 131-134. The input signals on the tree decoder start nodes 135 and stop nodes 145 comprise a portion of the start and stop pre-decoded addresses.

For any start address only one of the start nodes 150 will receive an active signal. The active signal selects one column decoder output in each column decoder output group 121-124. However, only the column decoder output in the column decoder output group corresponding to the enabled tree-decoder group is activated. Similarly, for any stop address only one of the stop nodes 155 will receive an active signal. The active signal enables one column decoder output in each column decoder output group 121-124. However, only the column decoder output in the column decoder output group corresponding to the enabled tree-decoder group is activated. The input signals on the start and stop nodes 150 and 155 comprise the remaining portion of the start and stop pre-decoded addresses. The tree decoder 95 and the portion of the column decoder 90 coupled to start nodes 150 can be thought of as start select circuitry since they determine the start decoder output, and the tree decoder 95 and the portion of the column decoder 90 coupled to stop nodes 155 can be thought of as stop select circuitry since they determine the stop decoder output.

When the active low window flash enable (WINFLASHEN*) signal at WINFLASHEN* input node 160 goes low, a low potential is available to enable start ripple AND circuitry 156 and to enable stop ripple AND circuitry 157.

The start and stop ripple AND circuitries are interposed between the low potential connected to the WINFLASHEN* input node 160 and a supply potential connected at supply nodes 161 and 162 respectively. The supply potential may be driven to the supply nodes 161 and 162 in a timing sequence substantially corresponding to the timing sequence of the WINFLASHEN* signal. The supply potential may also be supplied by other methods in order to minimize power requirements of the circuit.

If only a start address is selected then a normal write operation to a single cell may be performed. In this case the WINFLASHEN* signal is inactive or high.

In the preferred embodiment both a start and stop address are selected. For the circuit of FIG. 2 the start address must activate a start column decoder output node 101-116 node and the stop address must activate a stop column decoder output 101-116 wherein the designation number 101-116 of the start column decoder output is less than the designation number 101-116 of the stop column decoder output. Start ripple AND circuitry 156 and stop ripple AND circuitry 157 activate all of the decoder outputs interposed between the start column decoder output node and the stop column decoder output node. These interposed column decoder output nodes and the start and stop column decoder output nodes form the window of column decoder outputs selected for the write operation. Therefore, the decode transistors in electrical communication with each of the windowed column decoder outputs are enabled and data is transmitted to the digit line pair from the selected I/O lines.

In order to provide a better understanding of the invention a specific example is hereby described in reference to FIGS. 2 and 3. FIG. 3 is the portion of the circuit of FIG. 2 containing the column decoder outputs 101-106.

Assume it is desired to write to the input lines through latch circuitry enabled by activating column decoder outputs 102-105. In this case column decoder output 102 is the start column decoder output and column decoder output 105 is the stop column decoder output. A low signal at the COLDECEN* input node 97 enables transistors 163 and 164 thereby enabling the tree decoder 95. The low signal at the COLDECEN* input node 97 deactivates transistors 118 thereby allowing the column decoder outputs 101-116 and intermediate nodes 117 to float at the low potential. Referring to FIG. 3, a low on start nodes 170 and 175 and a high on the remaining start nodes 150 and start input nodes 135 comprises the start address. The start address activates column decoder output 102 when the low on start node 175 enables column decoder group 121 and a low on start node 170 enables the column decoder output 102. A low on stop nodes 180 and 185 and a high on the remaining stop nodes 155 and stop input nodes 145 comprises the stop address. The stop address activates column decoder output 105 when the low on stop node 185 enables the column decoder group 122 and a low on stop node 180 enables the column decoder output 105.

The potential of the start column decoder output node 102 is pulled toward the high supply potential, $V_{cc}$, of supply node 199 through transistor 200(activated by the low signal at node 170), transistor 205(activated by the low signal at node 175) and transistor 164 (activated by the low signal at the COLDECEN* node 97). Similarly the potential of the stop column decoder output node 105 is pulled toward the high supply potential of supply node 199 through transistor 215(activated by a low signal at node 180), transistor 220(activated by a low signal at node 185), and transistor 163 (activated by the low signal at the COLDECEN node 97).

The WINFLASHEN* signal at the WINFLASHEN* node 160 goes low to enable the start and stop ripple AND circuities 156 and 157. The high at the start column decoder output node 102 activates transistor 250 and deactivates transistor 251. Activated transistor 250 transmits the low WINFLASHEN* signal to the gate 252 of transistor 255 thereby activating transistor 255. Activated transistor 255 passes a high supply potential, $V_{cc}$, on supply node 256 through activated transistors 255 and 265 to column decoder output node 103 and to the gate of transistor 267 thereby activating transistor 267 and deactivating transistor 268. Activated transistor 267 in turn transmits the low WINFLASHEN* signal to the gate 269 of transistor 270 thereby activating transistor 270. Activated transistor 270 passes the high supply potential on supply node 256 through activated transistors 270 and 275 to column decoder output node 104.

Supply nodes 199 and 256 are typically connected to the same supply potential and are only differentiated in order to simplify the explanation of the embodiment herein described.

Both the start ripple AND circuitry and the stop ripple AND circuitry incorporate look-ahead circuitry for increasing the speed of activating the window of column decoder outputs. The high supply potential connected from supply node 199 to column decoder output node 102 deactivates transistor 280 and activates transistor 285. Deactivated transistor 280 isolates node 290 from the supply node 161 and activated transistor 285 connects the low WINFLASHEN* signal to node 290. This isolation of the remaining start ripple AND circuitry from the supply potential and the coupling of node 290 to the low potential provides a look ahead propagation which enables the succeeding column decoder output group 122. In this case column decoder output 105 is the stop output and no more column decoder outputs are activated since there is no AND function existing between the start and stop ripple AND circuitry.

The look ahead circuitry of the stop ripple AND circuitry functions similarly to the look ahead circuitry of the start ripple AND circuitry. In the example, the high supply potential transmitted from supply node 199 to column decoder output node 105 deactivates transistor 300 isolating node 305 from the high supply potential at supply node 162 and activates transistor 315 coupling the low WINFLASHEN* signal to node 305 thereby providing a look ahead ripple effect for the column decoder group 121.

The low on node 305 activates transistor 275 which transmits the high supply potential on node 199 to the gate of transistor 320 thereby activating transistor 320. Activated transistor 320 transmits the low WINFLASHEN* signal to the gate of transistor 265 thereby activating transistor 265. In the stop circuitry the signal continues to propagate in the direction from the stop decoder output toward the start decoder output and beyond the start decoder output. Therefore transistors 321 and 322 are also activated.

Activated transistors 255 and 265 provide the AND logic that allows the high supply potential on node 199 to be transmitted to the column decoder output 103.

Activated transistors 275 and 270 provide the AND logic that allows the high supply potential on node 199 to be transmitted to the column decoder output 104.

However, since transistor 323 is not activated the AND logic provided by transistor 322 and 323 being serially connected prohibits column decoder output 101 from being activated.

In a second example, suppose the start decoder output is still 102 but the stop decoder output is 114, see FIG. 2. In this case each of the transistors 350 and 351 are activated by the floating low potential on one of the nodes 355 with which it is in electrical communication. The low on nodes 355 is effected when transistors 360 deactivate due to the active low COLDECEN* signal at the COLDECEN* node 97. Activated transistors 350 therefore transmit the low potential at node 290 (see FIG. 2) to the gates of transistors 370 thereby creating the look ahead affect. Similarly the stop ripple AND circuitry implements the look ahead affect by coupling the low potential at node 375 through activated transistors 351 in order to activate transistors 380. Thus by activating the first column decoder output in each group interposed between the start and stop decoder output, the start and stop active column decoder output signals are substantially simultaneously propagated through all the possible groups in the respective start and stop ripple AND circuitries 156 and 157.

The invention may also comprise comparator circuitry to compare addresses to determine the start and stop address. The start and stop addresses can then be directed to the appropriate start input nodes 135 and 150 and stop input nodes 145 and 155 in order to ensure that the designation number of the start decoder output is less than the designation number of the stop decoder output. The comparator circuit is well-known to those in the art and is just one method that may be used to provide the correct relationship in the circuit between the start and stop decoder outputs.

A timing diagram shown in FIG. 4 is a simplification of a possible timing relationship for the circuit of the invention. The timing diagram illustrates the implementation of the start and stop pre-decoded addresses in relation to the row address strobe (RAS), the column address strobe (CAS), and the data supplied to the DQ.

It can be seen that the invention is a circuit and method that provides for the fast selection of a window of memory locations to be written into a DRAM or serial access port, thereby significantly increasing the speed of the VRAM. The circuit should not be construed to be only applicable to VRAMS. The invention is viable in any application where intervening coordinates are defined in terms of two given coordinates.

It should be apparent to those skilled in the art that other circuit implementations and methods can define a window of column decoder outputs between a stop and start address without departing from the spirit and scope of the invention described herein. Also different combinations of input signals can provide the user with various options. Therefore, the claimed invention should only be limited by the following claims.

What is claimed is:

1. A method of activating at least one of a plurality of decoder outputs of a decoder, comprising the following steps:
   a) selecting a start address;
   b) activating a start decoder output to provide an active start output signal at said start decoder output in response to said start address;
   c) selecting a stop address;
   d) activating a stop decoder output to provide an active stop output signal at said stop decoder output in response to said stop address;
   e) propagating said active start output signal through start ripple circuitry in order to enable all of the decoder outputs in a first direction from said start decoder output;
   f) propagating said active stop output signal through stop ripple circuitry in order to enable all of the decoder outputs in a second direction from said stop decoder output; and
   g) activating said decoder outputs enabled by said propagating of both said active start and said active stop output signals.

2. The method as specified in claim 1, wherein:
   a) said step of propagating said active start output signal further comprises enabling each one of the decoder outputs in said first direction in response to a signal of a preceding decoder output; and wherein
   b) said step of propagating said active stop output signal comprises enabling each one of the decoder outputs in said second direction in response to a signal of a preceding decoding output.

3. The method as specified in claim 1, further comprising the step of providing a look-ahead effect for increasing a speed of said propagating said active start output signal and for increasing a speed of said propagating of said active stop output signal.

4. The method as specified in claim 3, wherein said providing said look-ahead effect further comprises the following steps:
   a) isolating a portion of said start ripple circuitry from a first potential to form an isolated portion of said start ripple circuitry, said step of isolating performed in response to said active start output signal;
   b) coupling a second potential to said isolated portion; and
   c) enabling a first decoder output in a group of the decoder outputs in said first direction of said isolated portion in response to said second potential.

5. The method as specified in claim 4, further comprising the step of propagating an enable signal of said first decoder output in order to enable a next succeeding decoder output from said first decoder output.

6. The method as specified in claim 4, wherein:
   a) said isolating said portion of said start ripple circuitry further comprises deactivating a first switching device (280) in response to said active start output signal in order to effect said isolating; and wherein
   b) said coupling said second potential to said isolated portion further comprises activating a second switching device (285) in response to said active start output signal in order to provide electrical continuity between a reference node 160 having said second potential and a primary ripple node 290, thereby coupling said second potential from said reference node to said primary ripple node, said second potential on said primary ripple node affecting said step of enabling.

7. The method as specified in claim 3, wherein said providing said look-ahead effect further comprises the following steps:
   a) isolating a portion of said stop ripple circuitry from a first potential to form an isolated portion of said stop ripple circuitry, said step of isolating performed in response to said active stop output signal;
   b) coupling a second potential to said isolated portion; and
   c) enabling a first decoder output in a group of the decoder outputs in said second direction of said isolated portion in response to said second potential.

8. The method as specified in claim 7, further comprising the step of propagating an enable signal on said first decoder output in order to enable a next succeeding first decoder output from said first decoder output.

9. The method as specified in claim 7, wherein:
a) said isolating said portion of said stop ripple circuitry further comprises deactivating a first switching device (300) in response to said active stop output signal in order to effect said isolating; and wherein
b) said coupling said second potential to said isolated portion further comprises activating a second switching device (315) in response to said active stop output signal in order to provide electrical continuity between a reference node (160) having said second potential and a primary ripple node (305), thereby coupling said second potential from said reference node to said primary ripple node, said second potential on said primary ripple node affecting said step of enabling.

10. The method as specified in claim 1, further comprising initially enabling said decoder.

11. The method as specified in claim 1, further comprising:
a) activating a decode switching device for said start decoder output, said stop decoder output, and said decoder outputs interposed between said start and said stop decoder outputs; and
b) transmitting data between input/output lines and a corresponding digit line pair through said decode switching device.

12. The method as specified in claim 1, wherein said propagating said active start output signal further comprises the following steps:
a) deactivating a first switching device (280) in response to said active start output signal thereby isolating a control node (290) from a first potential;
b) activating a second switching device (285) in response to said active start output signal thereby coupling said control node to said second potential; and
c) enabling a third switching device (291) in response to said second potential in order to enable the decoder output (105) coupled to said third switching device.

13. The method as specified in claim 1, wherein said propagating of said active stop output signal further comprises the following steps:
a) deactivating a first switching device in response to said active stop output signal thereby isolating a control node from a first potential;
b) activating a second switching device in response to said active stop output signal thereby coupling said control node to said second potential; and
c) enabling a third switching device in response to said second potential in order to enable the decoder output coupled to said third switching device.

14. A decoder having a plurality of decoder outputs (101-116), comprising:
a) start address input nodes for receiving a start address;
b) stop address input nodes for receiving a stop address;
c) start select circuitry interposed between said start address input nodes and said plurality of decoder outputs, said start select circuitry selecting a start decoder output in response to said start address, said start decoder output having an active start output signal;
d) stop select circuitry interposed between said stop address input nodes and said plurality of decoder outputs, said stop select circuitry selecting a stop decoder output in response to said stop address, said stop decoder output having an active stop output signal;
e) start ripple circuitry (156) coupled to the plurality of decoder outputs, said start ripple circuitry enabling all of said decoder outputs in a first direction in response to said active start output signal, said first direction initiated at said start decoder output and progressing toward said stop decoder output;
f) stop ripple circuitry (157) coupled to the plurality of decoder outputs for enabling all of said decoder outputs in a second direction in response to said active stop output signal, said second direction initiated at said stop decoder output and progressing toward said start decoder output; and
g) AND circuitry coupled to said start and said stop ripple circuitries, said AND circuitry activating all of said decoder outputs interposed between said start and said stop decoder outputs.

15. The decoder as specified in claim 14, further comprising look-ahead circuitry for increasing a speed at which said start and said stop ripple circuitries enable said decoder outputs in said first and said second directions respectively.

16. The decoder as specified in claim 14, further comprising a decode input (97) for accepting a decode signal for activating and deactivating said decoder.

17. The decoder as specified in claim 16, wherein said decode signal activates and deactivates said start and said stop select circuitries.

18. The decoder as specified in claim 16, further comprising an inactive state switching device (118) coupled to each of said decoder outputs, said inactive state switching device activated by said decode signal on said decode input in order to pull inactive decoder outputs of the plurality of decoder outputs to an inactive state.

19. The decoder as specified in claim 14, further comprising a WINFLASHEN input node for accepting a ripple signal for activating and deactivating said start and said stop ripple circuitries.

20. The decoder as specified in claim 14, wherein the decoder is a portion of a memory device, said decoder providing said active start output signal, said active stop output signal, and an active decoder output signal at said decoder outputs interposed between said start and said stop decoder outputs during only one timing cycle of said memory device.

21. The decoder as specified in claim 20, wherein said memory device is a dynamic random access device.

22. The decoder as specified in claim 20, wherein said memory device is a video random access device.

23. The decoder as specified in claim 14, further comprising:
a) a first control node coupled to said start ripple circuitry, a potential on said first control node controlling a propagation of an enable signal in said start ripple circuitry to each of said decoder outputs in said first direction from said first control node;
b) first isolation circuitry for isolating said first control node from a first potential in response to said active start output signal;
c) first coupling circuitry for coupling said first control node to a second potential in response to said active start output signal, said second potential initiating the propagation of said enable signal through said start ripple circuitry to each of said decoder outputs in said first direction from said first control node, said second potential on said first control node increasing a rate of propagation of said enable signal to each of said decoder outputs in said first direction;

d) a second control node coupled to said stop ripple circuitry, a potential on said second control node controlling a propagation in said stop ripple circuitry of an enable signal to each of said decoder outputs in said second direction from said second control node;

e) second isolation circuitry for isolating said second control node from said first potential in response to said active stop output signal; and f) second coupling circuitry for coupling said second control node to said second potential in response to said active stop output signal, said second potential initiating the propagation of said enable signal through said stop ripple circuitry to each of said decoder outputs in said second direction from said second control node, said second potential on said second control node increasing a rate of propagation of said enable signal to each of said decoder outputs in said second direction.

24. The decoder as specified in claim 23, further comprising a plurality of secondary first control nodes for controlling a propagation rate of said enable signal to each of said decoder outputs in said first direction.

25. The decoder as specified in claim 23, further comprising a plurality of secondary second control nodes for controlling a propagation rate of said enable signal to each of said decoder outputs in said second direction.

26. The decoder as specified in claim 23, further comprising AND circuitry, and AND circuitry activating all of said decoder outputs interposed between said start and said stop decoder outputs.

27. A method of activating at least one of a plurality of decoder outputs of a decoder, comprising the following steps:

a) selecting a start address;

b) activating a start decoder output to provide an active start output signal at said start decoder output in response to said start address;

c) propagating said active start output signal through start ripple circuitry in order to enable all of the decoder outputs in a first direction from said start decoder d) isolating a portion of said start ripple circuitry from a first potential to form a start isolated portion of said start ripple circuitry, said step of isolating performed in response to said active start output signal;

e) coupling a second potential to said start isolated portion;

f) enabling a first decoder output in a group of the decoder outputs in said first direction in response to said second potential coupled to said start isolated portion thereby increasing a rate of said step of propagating said active start output signal;

g) selecting a stop address;

h) activating a stop decoder output to provide an active stop output signal at said stop decoder output in response to said stop address;

i) propagating said active stop output signal through stop ripple circuitry in order to enable all of the decoder outputs in a second direction from said stop decoder output;

j) isolating a portion of said stop ripple circuitry from said first potential to form a stop isolated portion of said stop ripple circuitry, said step of isolating said portion of said stop ripple circuitry performed in response to said active stop output signal;

k) coupling said second potential to said stop isolated portion;

l) enabling a first decoder output in a group of the decoder outputs in said second direction in response to said second potential coupled to said stop isolated portion thereby increasing a rate of said step of propagating said active stop output signal; and m) activating said decoder outputs enabled by said propagating of both said active start and said active stop output signals.

28. A decoder having a plurality of decoder outputs, comprising:

a) start address input nodes for receiving a start address;

b) stop address input nodes for receiving a stop address;

c) start select circuitry interposed between said start address input nodes and said plurality of decoder outputs, said start select circuitry selecting a start decoder output in response to said start address, said start decoder output having an active start output signal driven to said start decoder output through said start select circuitry;

d) stop select circuitry interposed between said stop address input nodes and said plurality of decoder outputs, said stop select circuitry selecting a stop decoder output in response to said stop address, said stop decoder output having an active stop output signal driven to said stop decoder output through said stop select circuitry;

e) start ripple circuitry coupled to all of said decoder outputs in a first direction, said first direction initiated at said start decoder output and progressing toward said stop decoder output, said start ripple circuitry for enabling all of said decoder outputs in said first direction;

f) stop ripple circuitry coupled to all of said decoder outputs in a second direction, said second direction initiated at said stop decoder output and progressing toward said start decoder output, said stop ripple circuitry for enabling all of said decoder outputs in said second direction;

g) a first node (161, 162) for receiving a first potential;

h) a first switching device (280) coupled to said first node and responsive to said active start output signal;

i) a second node (160) for receiving a second potential;

j) a second switching device (285) coupled to said second node and responsive to said active start output signal;

k) a start node (290) coupled to said start ripple circuitry and to said first and said second switching devices, said start ripple circuitry responsive to a potential on said start node, said first switching device isolating said start node from said first node in response to said active start output signal, and said second switching device coupling said second node to said start node in response to said active start output signal thereby pulling said start node to said second potential, said second potential on said start node initiating a propagation of an enable signal to each of said decoder outputs through said start ripple circuitry in said first direction from said start node, and said second potential on said start node increasing a rate of enabling said decoder outputs in said first direction;

l) a third switching device coupled to said first node and responsive to said active stop output signal;

m) a fourth switching device coupled to said second node and responsive to said active stop output signal; and n) a stop node (305, 375) coupled to said stop ripple circuitry and to said third and said fourth switching devices, said stop ripple circuitry responsive to a potential on said stop node, said third switching device isolating said stop node from said first node in response to said active stop output signal, and said fourth switching device coupling said second node to said stop node in response to said active stop output signal thereby pulling said stop node to said second potential, said second potential on said stop node initiating a propagation of an enable signal to each of said decoder outputs through said stop ripple circuitry in said second direction from said stop node, and said second potential on said stop node increasing a rate of enabling said decoder outputs in said second direction.

* * * * *